(12) United States Patent
Lee et al.

(10) Patent No.: US 7,986,559 B2
(45) Date of Patent: Jul. 26, 2011

(54) METHOD OF OPERATING NONVOLATILE MEMORY DEVICE

(75) Inventors: Jung Hwan Lee, Seoul (KR); Seong Je Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 108 days.

(21) Appl. No.: 12/493,446

(22) Filed: Jun. 29, 2009

(65) Prior Publication Data

US 2010/0188903 A1    Jul. 29, 2010

(30) Foreign Application Priority Data

Jan. 23, 2009  (KR) .................. 10-2009-0006026

(51) Int. Cl.
*G11C 16/06* (2006.01)
(52) U.S. Cl. ........... 365/185.22; 365/185.2; 365/185.24; 365/185.19
(58) Field of Classification Search ............. 365/185.22, 365/185.2, 185.24, 185.19
See application file for complete search history.

(56) References Cited

U.S. PATENT DOCUMENTS
2005/0185470 A1*  8/2005  Suzuki et al. ............ 365/185.28

FOREIGN PATENT DOCUMENTS
KR       1020080038924        5/2008

OTHER PUBLICATIONS

Notice of Allowance issued from Korean Intellectual Property Office on Nov. 30, 2010.

* cited by examiner

*Primary Examiner* — Thong Q Le
(74) *Attorney, Agent, or Firm* — IP & T Group LLP

(57) ABSTRACT

A method of operating a nonvolatile memory device includes performing a first program operation and a first verification operation on memory cells until a cell, having a threshold voltage higher than a first reference voltage, occurs and, when a cell having the threshold voltage higher than the first reference voltage occurs, performing a second program operation and performing a second verification operation using a second reference voltage higher than the first reference voltage.

14 Claims, 7 Drawing Sheets

_US 7,986,559 B2_

METHOD OF OPERATING NONVOLATILE MEMORY DEVICE

CROSS-REFERENCES TO RELATED APPLICATIONS

Priority to Korean patent application number 10-2009-0006026 filed on Jan. 23, 2009, the entire disclosure of which is incorporated by reference herein, is claimed.

BACKGROUND

One or more embodiments relate to a method of operating a nonvolatile memory device.

Recently, there has been an increasing demand for nonvolatile memory devices which can be electrically programmed and erased and do not require the refresh function of rewriting data at specific intervals.

A nonvolatile memory cell enables an electrical program/erase operation and performs the program and erase operations by varying threshold voltages when electrons are migrated by a strong electric field applied to a thin oxide layer.

A nonvolatile memory device may include a memory cell array in which cells configured to store data are arranged in matrix form and a page buffer configured to write data into specific cells of the memory cell array or to read data stored in specific cells of the memory cell array. The page buffer includes bit line pairs connected to specific memory cells, registers configured to temporarily store data to be programmed into the memory cell array or to temporarily store data read from specific cells of the memory cell array, a sense node configured to sense the voltage level of a specific bit line or a specific register, and a bit line select unit configured to control whether or not to connect the specific bit line and the sense node.

In the verification operation of such a nonvolatile memory device, there is a concern that read margin decreases since under-programmed cells are obtained due to a source line bouncing phenomenon. Further, a bouncing phenomenon in which the voltage level of a source line varies depending on the program state of neighboring cells (for example, cells at an end) occurs. Accordingly, the level of current passing through a specific cell is changed. Consequently, cells, which are determined to have been programmed, while actually not being fully programmed (i.e., under-programmed cells), are obtained.

Cells, which have not been programmed to have a first reference voltage PV1 or more, may be determined to have been programmed. Accordingly, read margin, corresponding to the difference between the first reference voltage PV1 and a read voltage Vread, decreases. This phenomenon may be detrimental to a Multi-Level Cell (MLC) program method. This is because, in the MLC program method, a read margin between two or more distributions of threshold voltages is desired to be large.

BRIEF SUMMARY

One or more embodiments are directed towards a method of operating a nonvolatile memory device, which performs verification by raising the reference voltage of a verification operation after a lapse of a certain time in order to prevent under-programmed cells.

An embodiment is directed to a method of operating a nonvolatile memory device, including performing a first program operation and a first verification operation on memory cells until a cell having a threshold voltage higher than a first reference voltage occurs and, when a cell having the threshold voltage higher than the first reference voltage occurs, performing a second program operation and performing a second verification operation using a second reference voltage higher than the first reference voltage.

The second reference voltage may be higher than the first reference voltage by about 50 mV. The second program operation and the second verification operation are to be performed for a number of times less than equal to a predetermined number. The second program operation and the second verification operation may be performed up to two times or three times.

When data stored in page buffers changes to program completion data, a cell having the threshold voltage higher than the first reference voltage may be determined to have occurred.

The method may further include, if a further program operation is to be performed after the second program operation and the second verification operation have been performed for the predetermined number of times, performing a third program operation and the first verification operation.

Another embodiment is directed to a method of operating a nonvolatile memory device, including performing a first program operation and a first verification operation on memory cells until a cell having a threshold voltage higher than a first reference voltage occurs, when a cell having the threshold voltage higher than the first reference voltage occurs, performing a second program operation and performing a second verification operation using a second reference voltage higher than the first reference voltage, and after the second program operation and the second verification operation have been performed for a predetermined number of times, performing a third program operation and the first verification operation until threshold voltages of the memory cells are higher than the first reference voltage.

Yet another embodiment is directed to a method of operating a nonvolatile memory device, including performing a first program operation and a first verification operation on first, second, and third memory cells until the first memory cell having a threshold voltage higher than a first reference voltage occurs, and when the first memory cell having the threshold voltage higher than the first reference voltage occurs, performing a second program operation and a second verification operation for a number of times equal to or less than a predetermined number of times. The second verification operation may be performed using a second reference voltage higher than the first reference voltage.

In the above embodiments, the method may include, if a further program operation and a further verification operation are to be performed after the second program operation and the second verification operation have been performed for the predetermined number of times, performing a third program operation and the first verification operation. Alternatively, the method may include, if a further program operation and a further verification operation are to be performed after the second program operation and the second verification operation have been performed for the predetermined number of times, performing a third program operation, the first verification operation, and the second verification operation. Alternatively, the method may include, if a further program operation and a further verification operation are to be performed after the second program operation and the second verification operation have been performed for the predetermined number of times, performing a third program operation, the first verification operation, and a third verification operation. The third verification operation is performed using a third reference voltage higher than the second reference voltage.

In the performance of the second program operation and the second verification operation, when data stored in page buffers changes to program completion data, the first memory cell having the threshold voltage higher than the first reference voltage may be determined to have occurred.

The second reference voltage may be higher than the first reference voltage by about 50 mV. The second program operation and the second verification operation may be performed up to two times or three times.

DESCRIPTION OF SPECIFIC EMBODIMENT

Hereinafter, the present disclosure will be described in detail in connection with one or more embodiments with reference to the accompanying drawings. The figures are provided to allow those having ordinary skill in the art to understand the scope of one or more embodiments of the disclosure.

Figure 1:
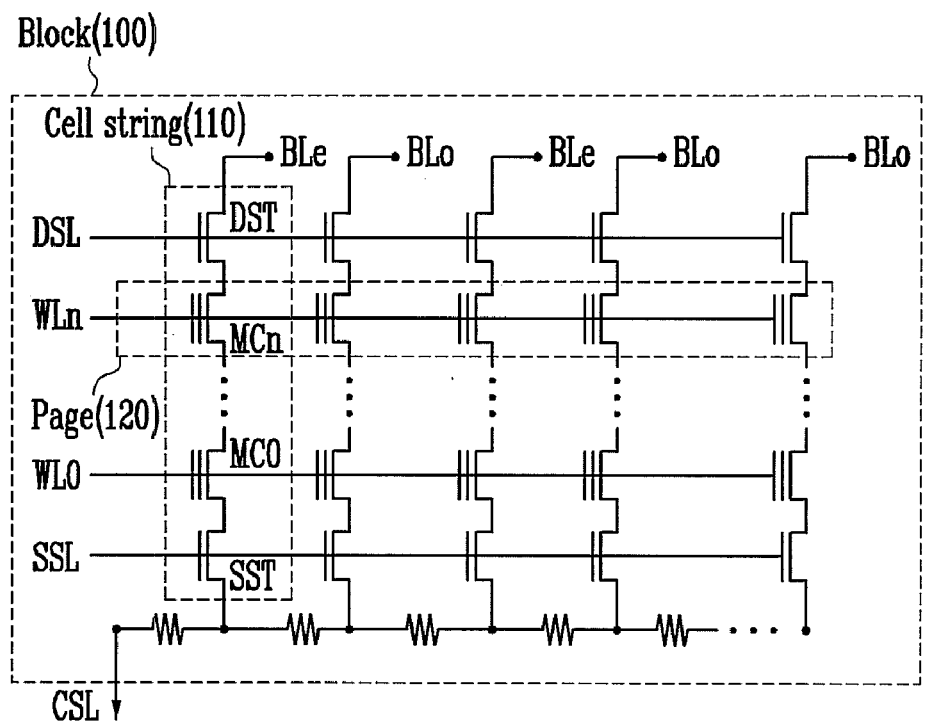
FIG. 1 is a diagram showing the construction of the memory cell array of a nonvolatile memory device to which one or more embodiments are applied.

FIG. 1 is a diagram showing the construction of the memory cell array of a nonvolatile memory device to which one or more embodiments are applied.

The memory cell array may be a single memory cell block 100 as shown in FIG. 1. The memory cell block 100 includes groups of memory cells MC0 to MCn configured to store data, word lines WL0, WL1, . . . , WLn configured to select and enable the memory cells, and bit lines BLe and BLo configured to input or output the data of the memory cells. The memory cell array has a structure in which groups of the word lines and groups of the bit lines are arranged in matrix form. The memory cell array includes drain select transistors DST connected between the bit lines and the memory cells and the source select transistors SST connected between the memory cells and a common source line CSL.

A group of the memory cells, connected in series between the source select transistor SST and the drain select transistor DST, is called a cell string 110. The gates of the memory cells are connected to the word lines, and a set of the memory cells in common connected to the same word line is called a page 120. The cell strings connected to the respective bit lines are connected in parallel to the common source line CSL, thus constituting a block.

Meanwhile, each of the cell strings is connected to the common source line CSL. Each of the source lines is connected to a metal bypass line (not shown) parallel to the bit line. Here, the source line (i.e., an $n^+$ diffused source line) includes a resistance component as shown in FIG. 1 and connected between respective neighboring source select transistors SST. Noise occurs because of a high resistance of the source line, thereby affecting the control of threshold voltages.

Figure 2A:
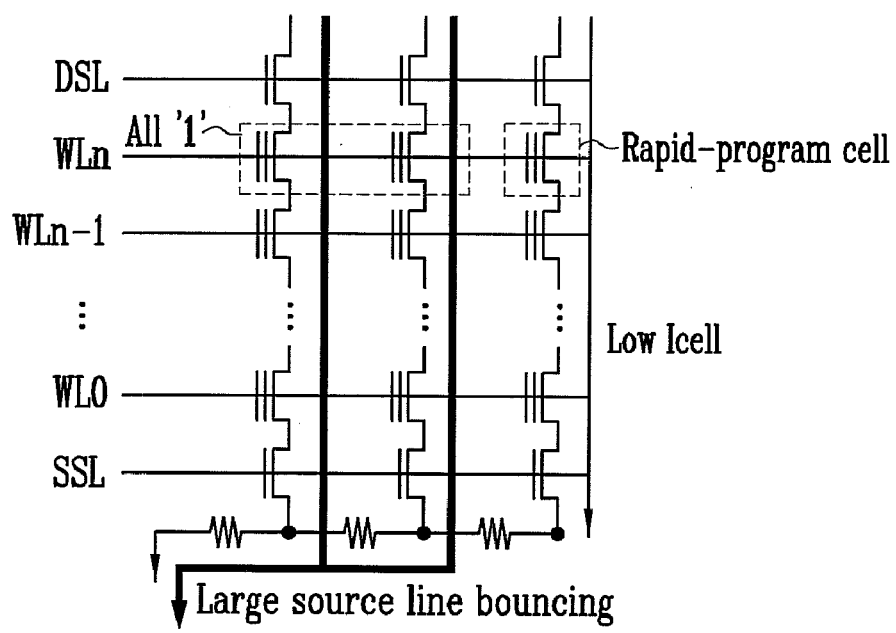
FIGS. 2A and 2B are diagrams showing a source line bouncing phenomenon occurring because of the resistance component of a source line.
Figure 2B:
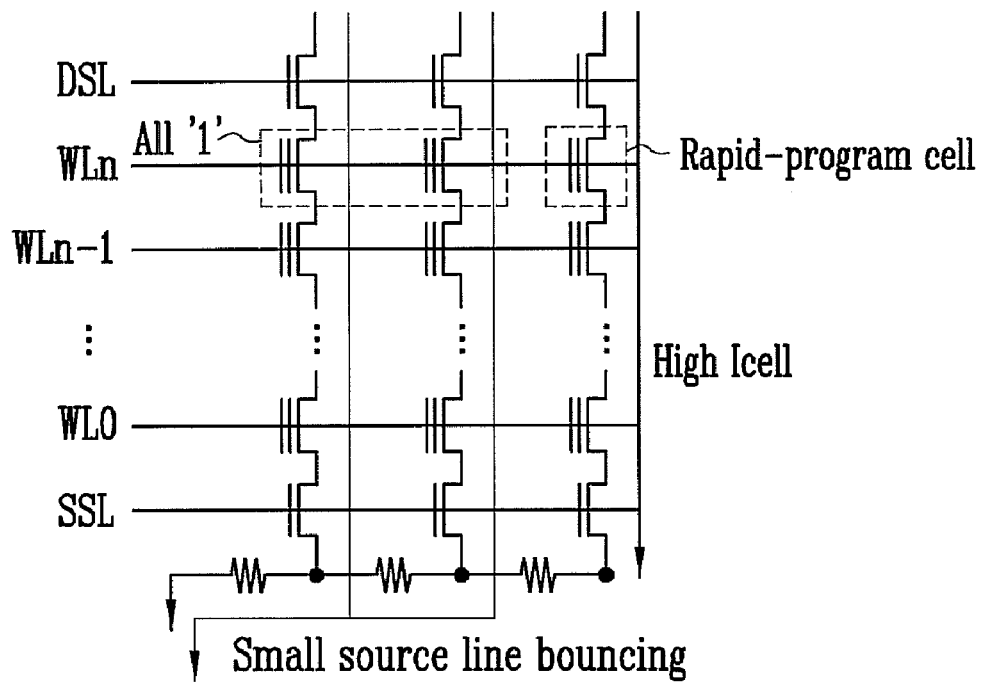

FIGS. 2A and 2B are diagrams showing a source line bouncing phenomenon that occurs because of the resistance component of a source line.

It is assumed that, in these drawings, a page connected to a selected word line is programmed. In FIG. 2A, the page includes not only a cell that is first programmed (i.e., a rapid-program cell), but also slow-program cells, which may be the subject of program operations with respect to the same word line, but do not become fully programmed (for example, being under-programmed).

All of the slow-program cells (labeled as '1') are discharged from a precharge level to a ground voltage as they are not yet programmed. Here, the voltage of the source line rises due to the resistance of the source line, where the source voltage of the rapid-program cell also rises. Accordingly, the sensing current Icell of the rapid-program cell decreases because of the above-discussed noise (that is, a rise in a source line voltage) of the common source line. Rapid-program cells are determined to have been programmed because of the decreased current even though they have a threshold voltage lower than a verification voltage. The program operation is stopped from being performed on the rapid-program cells because the cells are considered as having been programmed to a reference voltage (that is, to equal to or exceed the reference voltage).

FIG. 2B shows a state where, since all of the slow-program cells have been programmed, the noise of the common source line is reduced. Current flowing through the rapid-program cell may further increase since the noise of the common source line is reduced.

A bouncing phenomenon in which the voltage level of a source line varies depending on the program state of neighboring cells occurs, so the level of current passing through a specific cell changes. Consequently, cells which are determined to have been programmed, while not being fully programmed (i.e., under-programmed cells), are obtained.

Figure 3:
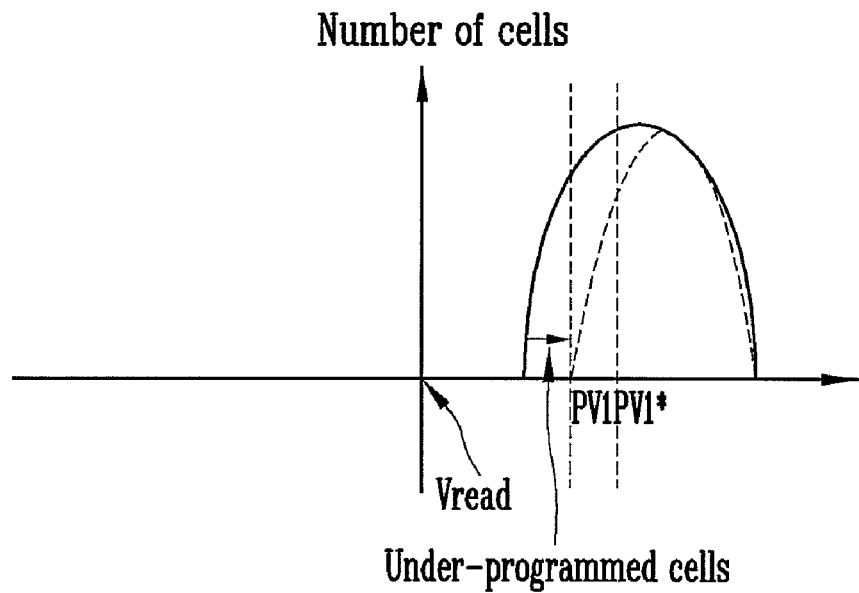
FIG. 3 is a graph showing an under-program phenomenon occurring in the nonvolatile memory device.

FIG. 3 is a graph showing an under-program phenomenon occurring in the nonvolatile memory device.

As shown in FIG. 3, cells, even though they have not programmed to have a first reference voltage PV1 or more, are read as having been programmed because of the above reasons. Accordingly, read margin, corresponding to the difference between the first reference voltage PV1 and a read voltage Vread, is reduced. This phenomenon may be detrimental to the MLC program method. This is because, in the MLC program method, read margin between two or more distributions of threshold voltages is desired to be large.

One or more embodiments are contrived to solve an under-program problem caused by the source line bouncing phenomenon.

Figure 4:
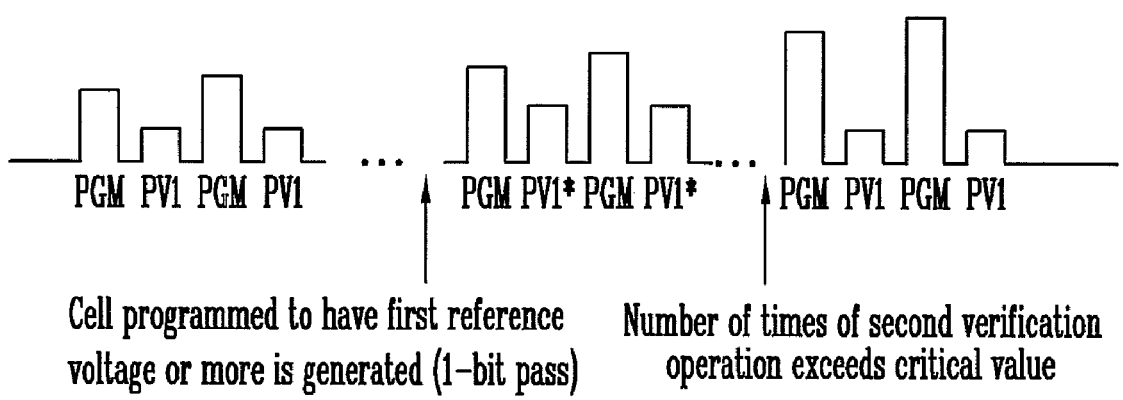
FIG. 4 is a diagram showing the program and verification operation of the nonvolatile memory device according to an embodiment.
Figure 5:
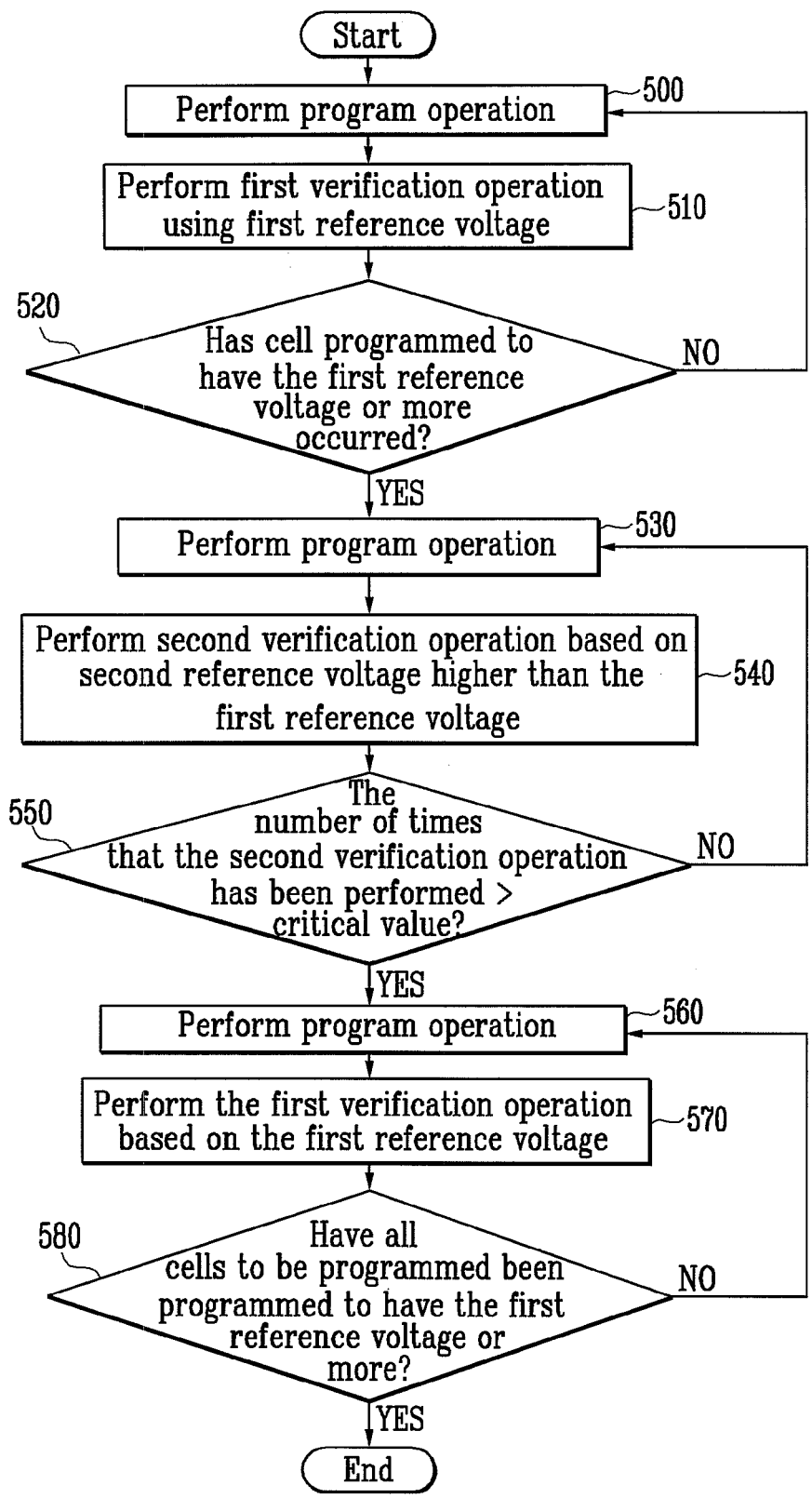
FIG. 5 is a flowchart showing a method of operating the nonvolatile memory device according to an embodiment.

FIG. 4 is a diagram showing the program and verification operation of the nonvolatile memory device according to an embodiment, and FIG. 5 is a flowchart showing a method of operating the nonvolatile memory device according to an embodiment.

First, a program operation is performed at step 500.

The program operation is performed in accordance with an Incremental Step Pulse Program (ISPP) method. The program operation is performed by applying a program voltage, having a program pulse form, to the word line. A verification operation is performed after application of each program pulse and, whenever a program pulse is applied, a program operation is performed by raising the program voltage.

Next, a first verification operation is performed based on a first reference voltage PV1 at step 510.

That is, the verification operation is performed in order to check whether cells to be programmed have been programmed to have the first reference voltage PV1 or more. The first verification operation is performed using a known verification operation. In other words, after the bit lines are precharged to a high level, the first reference voltage PV1 is applied to a word line connected to a cell to be verified and a pass voltage Vpass is applied to word lines connected to the remaining cells. The remaining cells are all turned on by the pass voltage Vpass. When the threshold voltage of the cell to be verified is lower than the first reference voltage PV1, the corresponding cell is turned on. Consequently, the electric charges of the precharged bit lines are discharged toward the common source line via the cell strings.

However, when the threshold voltage of the cell to be verified is higher than the first reference voltage PV1, the corresponding cell is not turned on. Consequently, the voltage level of the bit line remains in a high-level state. Thus, it is determined whether the cells to be programmed have been programmed to have the first reference voltage PV1 or more by sensing a change in the voltage level of the bit line.

It is determined whether, as a result of the verification operation, a program of a cell to have the first reference voltage PV1 or more, which belongs to the cells to be programmed, has occurred at step 520.

It is not desirable to perform a verification operation using a second reference voltage (step 540), which will be described later, until a cell programmed to have the first reference voltage or more occurs. That is, a cell programmed to have the second reference voltage or more, where the second reference voltage is higher than the first reference voltage, does not occur until a cell programmed to have the first reference voltage or more occurs. Accordingly, this step functions as a step of determining a point of time at which a verification operation based on the second reference voltage is performed.

A point of time at which a cell programmed to have the first reference voltage or more first occurs, which belong to cells to be programmed, is identical to a point of time at which data to be programmed, stored in each page buffer, changes to program completion data. The point of time at which a cell programmed to have the first reference voltage or more first occurs is called 1-bit-pass point of time. A method of determining the 1-bit-pass point of time is described later on.

The program operation 500 and the first verification operation 510 are repeatedly performed until a cell programmed to have the reference voltage or more occurs.

If, as a result of the determination at step 520, a cell programmed to have the first reference voltage or more is determined to have occurred, a program operation is performed at step 530. A second verification operation based on a second reference voltage higher than the first reference voltage is then performed at step 540.

Here, cells to be programmed are identical to those in the first verification operation (step 510). That is, the second verification operation based on the second reference voltage is performed on cells which will be programmed to have the first reference voltage or more. While rapid-program cells are obtained, the cells are programmed to have the second reference voltage or more in order to prevent under-programmed cells from occurring. As described above, the source line bouncing phenomenon may occur because a cell is determined to have been programmed to the first reference voltage, while not being fully programmed to have the first reference voltage or more, because of a rapid-program cell having a high program speed. This problem can be solved when a verification operation is performed with a raised reference voltage. The second reference voltage (PV1*) may be raised as much as the difference between the lowest one of the threshold voltages of under-programmed cells and the first reference voltage. Alternatively, the second reference voltage (PV1*) may be set to be 50 mV to 100 mV higher than the first reference voltage PV1.

Referring back to FIG. 3, it can be seen that, when the second verification operation is performed on the basis of the second reference voltage (PV1*), the number of under-programmed cells can be reduced.

This second verification operation is performed up to a limited number of times. If the second verification operation is allowed to be performed without a limit, the time that it takes to perform a program operation is increased because of the time it takes to program a cell not having a high program speed to the second reference voltage.

For this reason, it is determined whether the number of times that the second verification operation has been performed is more than a critical value at step 550. If, as a result of the determination, the number of times that the second verification operation has been performed is determined to be equal to or smaller than the critical value, the program operation (step 530) and the second verification operation (step 540) are repeatedly performed.

However, if, as a result of the determination, the number of times that the second verification operation has been performed is determined to be more than the critical value, a program operation is performed at step 560 and a first verification operation based on the first reference voltage is then performed at step 570.

Here, the critical value may be set to a certain value such as 2 or 3 or may be adjustable depending on the characteristic of the memory cells, the program speed, etc.

Next, the program operation (step 560) and the first verification operation (step 570) are repeatedly performed until all of the cells to be programmed are programmed to have the first reference voltage or more at step 580.

Here, in each of the program operations (steps 500, 530, and 560), a program pulse raised by a step voltage is applied according to the ISPP method.

A method of determining a point of time at which a cell programmed to have the first reference voltage or more occurs is described below.

Figure 6:
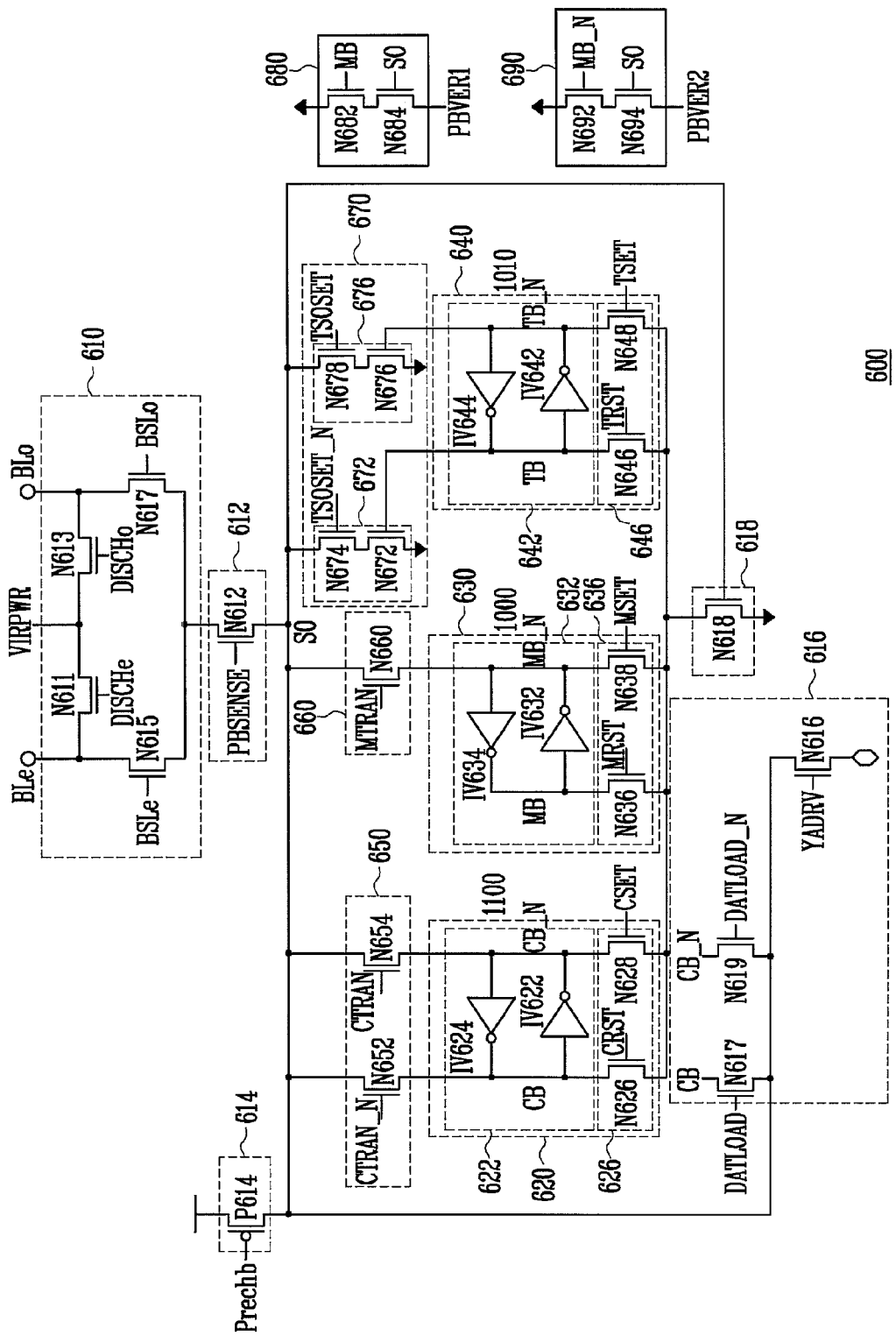
FIG. 6 is a diagram showing the page buffer of the nonvolatile memory device to which one or more embodiments are applied.

FIG. 6 is a diagram showing the page buffer of the non-volatile memory device to which one or more embodiments are applied.

It is to be noted that the page buffer of FIG. 6 is exemplary and may be modified in various ways.

The page buffer 600 includes a bit line select unit 610, a bit line sensing unit 612, a sense node precharge unit 614, a data input unit 616, a sense node sensing unit 618, a first register 620, a second register 630, a third register 640, a first data transmission unit 650, a second data transmission unit 660, a sense node discharge unit 670, a pass completion determination unit 680, and a 1-bit-pass determination unit 690.

The bit line select unit 610 includes an NMOS transistor N615 configured to connect an even bit line BLe and a sense node SO in response to a first bit line select signal BSLe and an NMOS transistor N617 configured to connect an odd bit line BLo and the sense node SO in response to a second bit line select signal BSLo. The bit line select unit 610 further includes a variable voltage input terminal configured to apply the variable voltage VIRPWR of a specific level, an NMOS transistor N611 configured to connect the even bit line BLe and the variable voltage input terminal in response to a first discharge signal DISCHe, and an NMOS transistor N613 configured to connect the odd bit line BLo and the variable voltage input terminal in response to a second discharge signal DISCHo.

A specific bit line and the sense node may be selectively connected depending on the above construction. The bit line sensing unit 612 includes an NMOS transistor N612 configured to turn on in response to a bit line sense signal PBSENSE and connected to the bit line select unit 610 and the sense node SO. When a verification/read operation is performed, the bit line sensing unit 612 applies a sensing voltage so that the state of a specific memory cell can be transferred to the sense node SO. In one or more embodiments, the bit line sensing unit 612 may be removed, and the function of the bit line sensing unit 612 may be replaced with the bit line select transistors N615 and N617 of the bit line select unit 610.

The sense node precharge unit 614 applies a high-level voltage VDD to the sense node SO in response to a precharge signal Prechb. To this end, the sense node precharge unit 614 includes a PMOS transistor P614 connected between the power source terminal VDD and the sense node SO. Accordingly, the power supply voltage of a high level is applied to the sense node SO in response to the precharge signal of a low level.

The data input unit 616 receives external data and transfers it to the first register. To this end, the data input unit 616 includes an NMOS transistor N616 configured to transfer external data in response to an input driving signal YADRV, an NMOS transistor N617 configured to transfer the external data to the first node CB of the first register in response to a first data input signal DATALOAD, and an NMOS transistor N619 configured to transfer the external data to the second node CB_N of the first register in response to a second data input signal DATALOAD_N.

The sense node sensing unit 618 applies a ground voltage to each of the registers 620, 630, and 640 depending on the voltage level of the sense node. To this end, the sense node sensing unit 618 includes an NMOS transistor N618 having a gate to which the sense node is connected and connected between each of the registers 620, 630, and 640 and a ground terminal. Accordingly, the ground voltage is applied to each of the registers depending on the voltage level of the sense node.

The first register 620 includes a latch unit 622 configured to store data and a data setting unit 626 configured to transfer the ground voltage, transferred by the ground voltage supply unit 618, to the latch unit 622 in response to data setting signals CRST and CSET. The latch unit 622 includes a first inverter IV622 and a second inverter IV624. The output terminal of the first inverter IV622 is connected to the input terminal of the second inverter IV624, and the output terminal of the second inverter IV624 is connected to the input terminal of the first inverter IV622. A node between the input terminal of the first inverter IV622 and the output terminal of the second inverter IV624 is called the first node CB. A node between the output terminal of the first inverter IV622 and the input terminal of the second inverter IV624 is called the second node CB_N. Accordingly, data having opposite levels are stored in the first node CB and the second node CB_N.

The data setting unit 626 includes an NMOS transistor N626 and an NMOS transistor N628. The NMOS transistor N626 applies the ground voltage, transferred by the ground voltage supply unit 618, to the first node CB in response to the first data setting signal CRST. The NMOS transistor N628 applies the ground voltage, transferred by the ground voltage supply unit 618, to the second node CB_N in response to the second data setting signal CSET.

The second register 630 includes a latch unit 632 configured to store data and a data setting unit 636 configured to transfer the ground voltage, transferred by the ground voltage supply unit 618, to the latch unit 632 in response to data setting signals MRST and MSET. The latch unit 632 includes a first inverter IV632 and a second inverter IV634. The output terminal of the first inverter IV632 is connected to the input terminal of the second inverter IV634, and the output terminal of the second inverter IV634 is connected to the input terminal of the first inverter IV632. A node between the input terminal of the first inverter IV632 and the output terminal of the second inverter IV634 is called the first node MB. A node between the output terminal of the first inverter IV632 and the input terminal of the second inverter IV634 is called the second node MB_N. Accordingly, data having opposite levels are stored in the first node MB and the second node MB_N.

The data setting unit 636 includes an NMOS transistor N636 and an NMOS transistor N638. The NMOS transistor N636 applies the ground voltage, transferred by the ground voltage supply unit 618, to the first node MB in response to a first data setting signal MRST. The NMOS transistor N638 applies the ground voltage, transferred by the ground voltage supply unit 618, to the second node MB_N in response to a second data setting signal MSET.

The third register 640 includes a latch unit 642 configured to store data and a data setting unit 646 configured to transfer the ground voltage, transferred by the ground voltage supply unit 618, to the latch unit 642 in response to data setting signals TRST and TSET.

The latch unit 642 includes a first inverter IV642 and a second inverter IV644. The output terminal of the first inverter IV642 is connected to the input terminal of the second inverter IV644, and the output terminal of the second inverter IV644 is connected to the input terminal of the first inverter IV642. A node between the input terminal of the first inverter IV642 and the output terminal of the second inverter IV644 is called the first node TB. A node between the output terminal of the first inverter IV642 and the input terminal of the second inverter IV644 is called the second node TB_N. Accordingly, data having opposite levels are stored in the first node TB and the second node TB_N.

The data setting unit 646 includes an NMOS transistor N646 and an NMOS transistor N648. The NMOS transistor N646 applies the ground voltage, transferred by the ground voltage supply unit 618, to the first node TB in response to the first data setting signal TRST. The NMOS transistor N648 applies the ground voltage, transferred by the ground voltage supply unit 618, to the second node TB_N in response to the second data setting signal TSET.

The first data transmission unit 650 includes an NMOS transistor N652 and an NMOS transistor N654. The NMOS transistor N652 transfers data, stored in the first node CB of the first register 620, to the sense node in response to a first data transmission signal CTRAN_N. The NMOS transistor N654 transfers data, stored in the second node CB_N of the first register 620, to the sense node in response to a second data transmission signal CTRAN. Accordingly, data stored in a specific node can be transferred to the sense node in response to a specific data transmission signal.

The second data transmission unit 660 includes an NMOS transistor N660 configured to transfer data, stored in the second node MB_N of the second register 630, to the sense node in response to a data transmission signal MTRAN.

The sense node discharge unit 670 includes a first discharge unit 672 and a second discharge unit 676. The first discharge unit 672 discharges the sense node to a ground level in response to a first sense node discharge signal TSOSET_N and depending on the level of the first node TB of the third register 640. The second discharge unit 676 discharges the sense node to a ground level in response to a second sense node discharge signal TSOSET and depending on the level of the second node TB_N of the third register 640.

The first discharge unit 672 includes first and second NMOS transistors N672 and N674 connected in series between the sense node SO and the ground. Here, as shown in FIG. 6, the first NMOS transistor N672 connected to the ground is configured to turn on in response to the first node TB, and the second NMOS transistor N674 connected to the sense node SO is configured to turn on in response to the first sense node discharge signal TSOSET_N. Alternatively, the first NMOS transistor N672 connected to the ground may be configured to turn on in response to the first sense node discharge signal TSOSET_N, and the second NMOS transistor N674 connected to the sense node may be configured to turn on in response to the first node TB. Accordingly, when the first sense node discharge signal TSOSET_N is applied and data stored in the first node TB is high-level data, the sense node may be discharged to the ground level.

The second discharge unit 676 includes third and fourth NMOS transistors N676 and N678 connected in series between the sense node SO and the ground. Here, as shown in FIG. 6, the third NMOS transistor N676 connected to the ground is configured to turn on in response to the second node TB_N, and the fourth NMOS transistor N678 connected to the sense node SO is configured to turn on in response to the second sense node discharge signal TSOSET. Alternatively, the third NMOS transistor N676 connected to the ground may be configured to turn on in response to the second sense node discharge signal TSOSET, and the fourth NMOS transistor N678 connected to the sense node may be configured to turn on in response to the second node TB_N. Accordingly, when the second sense node discharge signal TSOSET is applied and data stored in the second node TB_N is high-level data, the sense node may be discharged to the ground level.

The pass completion determination unit 680 includes first and second NMOS transistors N682 and N684 connected in series between the ground terminal and a first verification signal output terminal PBVER1. Here, the first NMOS transistor N682 is turned on in response to the first node MB of the first register, and the second NMOS transistor N684 is turned on in response to the sense node SO. Accordingly, when high-level voltage is applied to the sense node and high-level data is supplied to the first node MB of the first register, the ground voltage is output to the first verification signal output terminal PBVER1.

In the case where the ground voltage is applied to the first verification signal output terminal PBVER1, it is considered that a fail signal, indicating that verification has not been completed, is output. Typically, in the case of data to be programmed, data '0' is stored in the second node MB_N. After the data to be programmed has been programmed, the data '0' is converted into program completion data (i.e., data '1'). In other words, after all cells have been programmed, data '0' is stored in the first node MB. Accordingly, after all of the cells have been programmed, the first NMOS transistor N682 of each of the pass completion determination units 680 is turned off. Accordingly, the first verification signal output terminal PBVER1 becomes a floating state.

The pass completion determination unit 680 corresponds to the pass/fail check units 280 and 1290 disclosed in Korean patent application number 10-2008-0044127 filed by the applicant of this disclosure. Whether each of cells to be verified has been programmed to have a verification voltage or more can be checked using the pass completion determination unit 680. For a detailed construction of the pass completion determination unit 680, reference can be made to the disclosure.

The first bit pass determination unit 690 includes first and second NMOS transistors N692 and N694 connected in series between the ground terminal and a second verification signal output terminal PBVER2. Here, the first NMOS transistor N692 is turned on in response to the second node MB_N of the first register, and the second NMOS transistor N694 is turned on in response to the sense node SO.

Typically, in the case of data to be programmed, data '0' is stored in the second node MB_N. After the data to be programmed has been programmed, the data '0' is converted into data '1'. That is, in a typical read or verification operation, when any one cell is programmed to have a verification voltage or more, the voltage level of the sense node SO remains in a high level. Accordingly, when the sense node sensing unit 618 is driven, the ground voltage is transferred to the data setting unit 636. In this case, when the first data setting signal MRST is applied, the data '0' stored in the second node MB_N is converted into the data '1'. Accordingly, if a first cell to be verified is programmed to have a first verification voltage or more, a high-level voltage is applied to the sense node, and high-level data is applied to the second node MB_N of the first register. Consequently, the ground voltage is output to the second verification signal output terminal PBVER2. On the other hand, in the case of cells to be erased, data '1' is stored in the second node MB_N from the initial operation, but the voltage level of the sense node may remain in a low level during a read operation. Accordingly, the 1-bit-pass determination unit 690 does not output the ground voltage to the second verification signal output terminal PBVER2 by the cells to be erased.

Accordingly, in the case where the ground voltage is output to the second verification signal output terminal PBVER2, it is considered that one or more cells programmed to have the first verification voltage have occurred (i.e., 1-bit-pass has occurred).

Figure 7:
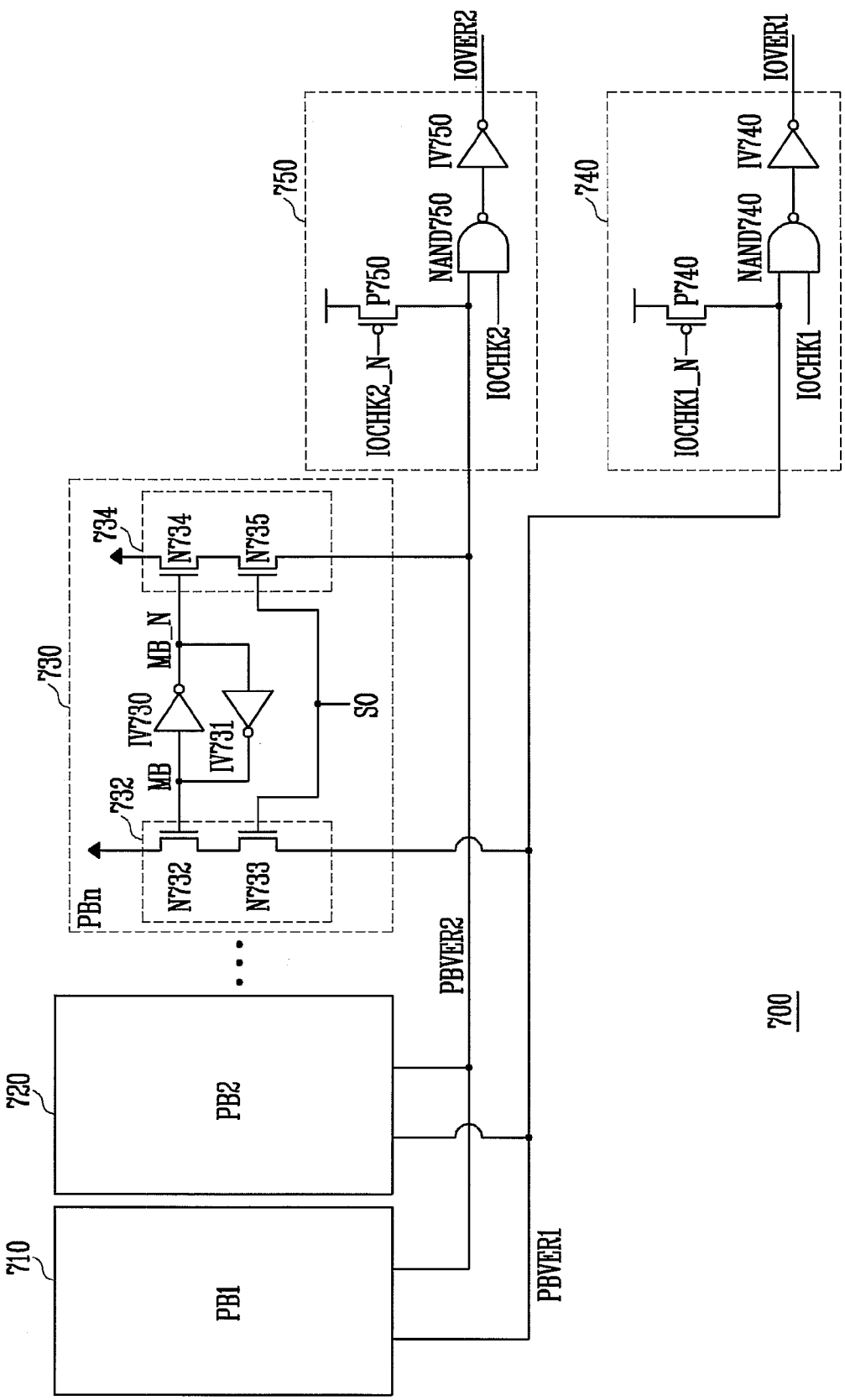
FIG. 7 is a diagram showing the connection relationship of a 1-bit-pass determination unit in a nonvolatile memory device to which one or more embodiments are applied.

FIG. 7 is a diagram showing the connection relationship of the 1-bit-pass determination unit in a nonvolatile memory device to which one or more embodiments are applied.

The nonvolatile memory device 700 includes a number of page buffers 710, 720 to 730, a first logic combination unit 740, and a second logic combination unit 750. The first logic combination unit 740 outputs a signal, indicating that whether or not a pass has been completed, depending on the state of the first verification signal output terminal PBVER1. The second logic combination unit 750 outputs a signal, indicating that whether or not a pass has been completed, depending on the state of the second verification signal output terminal PBVER2. Typically, one page buffer is connected to two different cells via an even bit line and an odd bit line. Accordingly, the number of page buffers may be half the number of cells included in one page.

As described above, each of the page buffers includes a pass completion determination unit 732 and a 1-bit-pass determination unit 734. The output terminal of the pass completion determination unit 732 of each of the page buffers is connected in parallel to the first verification signal output terminal PBVER1, and the output terminal of the 1-bit-pass determination unit 734 of each of the page buffers is connected in parallel to the second verification signal output terminal PBVER2. The pass completion determination unit 732 and the 1-bit-pass determination unit 734 have the same construction as the pass completion determination unit 680 and the 1-bit-pass determination unit 690 shown in FIG. 6.

The first logic combination unit 740 outputs a signal, indicating whether or not a pass has been completed, in response to a signal of the first verification signal output terminal PBVER1 and a first check signal IOCHK1. To this end, the first logic combination unit 740 includes a first pull-up element P740 configured to precharge the first verification signal output terminal PBVER1 to a high level in response to an inverted first check signal IOCHK1_N. The first pull-up element P740 includes a PMOS transistor P740 connected between the first verification signal output terminal PBVER1 and a power supply terminal and having a gate to which the inverted first check signal IOCHK1_N is input.

The first logic combination unit 740 further includes a NAND gate NAND740 configured to receive the signal of the first verification signal output terminal PBVER1 and a first check signal IOCHK1 and an inverter IV740 configured to invert and output the output of the NAND gate NAND740.

The operation of the first logic combination unit 740 is described below. First, when the first check signal IOCHK1 of a high level is applied, the first pull-up element P740 precharges the first verification signal output terminal PBVER1 to a high level. The high-level signal is also input to the NAND gate NAND740. As described above, if each of cells to be programmed is programmed to have a verification voltage or more, the output terminal of the pass completion determination unit 732 of a corresponding page buffer becomes a floating state. However, if there is a cell that has not been programmed to have the verification voltage or more, NMOS transistors N732 and N733 are turned on, so the first verification signal output terminal PBVER1 is grounded. When the first verification signal output terminal PBVER1 remains in the floating state, the precharge level by the first pull-up element P740 remains intact, so the pass completion signal IOVER1, indicating that all of the cells to be programmed have been programmed to have the verification voltage or more, is output. That is, if the pass completion signal IOVER1 of a high level is output, it is meant that all of the cells to be programmed have been programmed to have the verification voltage or more. If the pass completion signal IOVER1 of a low level is output, it is meant that there is a cell that has not been programmed to have the verification voltage or more. The detailed construction of the logic combination unit may be modified in various ways.

The second logic combination unit 750 outputs a signal, indicating the 1-bit-pass, in response to the signal of the second verification signal output terminal PBVER2 and a second check signal IOCHK2.

To this end, the second logic combination unit 750 includes a second pull-up element P750 configured to precharge the second verification signal output terminal PBVER2 to a high level in response to an inverted second check signal IOCHK2_N. The second pull-up element P750 includes a PMOS transistor P750 having a gate to which the inverted second check signal IOCHK2_N is input and connected between the second verification signal output terminal PBVER2 and the power supply terminal. The second logic combination unit 750 further includes an inverter IV750 configured to invert the output of a NAND gate NAND750. A signal of the second verification signal output terminal PBVER2 and the second check signal IOCHK2 are input to the NAND gate NAND750.

The operation of the second logic combination unit 750 is described below. First, when the second check signal IOCHK2 of a high level is applied, the second pull-up element P750 precharges the second verification signal output terminal PBVER2 to a high level. The high-level signal is also input to the NAND gate NAND750. For a program operation, data '0' or '1' is stored in the second node MB_N. The data '0' corresponds to a cell to be programmed, and the data '1' corresponds to a cell to be erased. Accordingly, the NMOS transistors N734 are turned off by the cells to be programmed and, therefore, the output terminals of the 1-bit-pass determination units 734 become a floating state. Furthermore, since the sense nodes of the cells to be erased may remain in a low-level state, the NMOS transistors N735 are turned off, so the output terminals of the 1-bit-pass determination units 734 become a floating state. That is, the second verification signal output terminal PBVER2 remains in the floating state until a cell programmed to have the verification voltage or more occurs by the program operation.

Next, as described above, if a cell programmed to have the first verification voltage or more occurs, the output terminal of the 1-bit-pass determination unit 734 of a corresponding page buffer becomes a ground state. That is, NMOS transistors N734 and N735 are turned on and, therefore, the second verification signal output terminal PBVER2 is grounded. Accordingly, the precharge level by the second pull-up element P750 is grounded by the second verification signal output terminal PBVER2. Consequently, a low-level signal is input to one terminal of the NAND gate NAND750. In response thereto, a 1-bit-pass signal IOVER2, indicating that one cell programmed to have the verification voltage or more has occurred, is output. That is, when the 1-bit-pass signal IOVER2 of a low level is output, it is meant that one cell programmed to have the verification voltage or more has occurred. When the 1-bit-pass signal IOVER2 of a high level is output, it is meant that any cell programmed to have the verification voltage or more has not occurred. A detailed construction of the logic combination unit may be modified in various ways.

Figure 8:
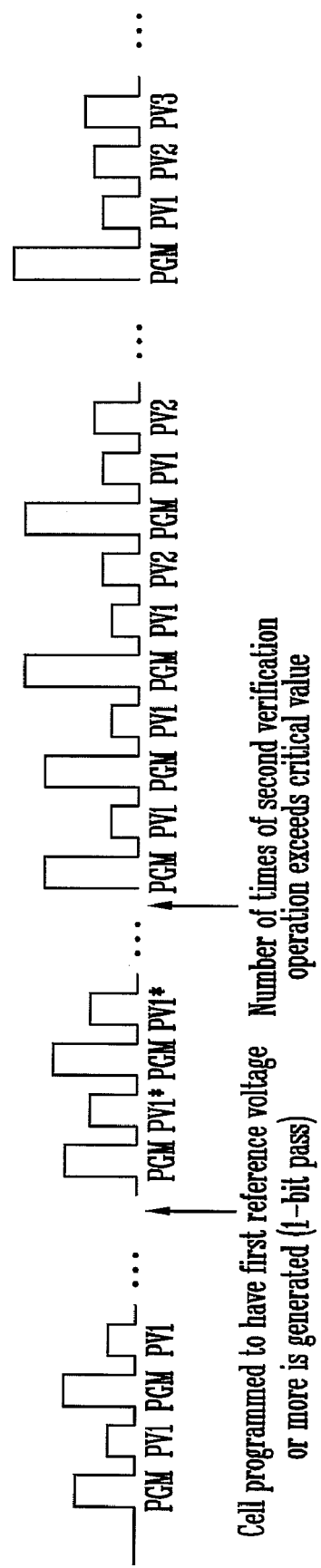
FIG. 8 is a diagram showing a program and verification operation of the nonvolatile memory device according to an embodiment.

FIG. 8 is a diagram showing a program and verification operation of the nonvolatile memory device according to an embodiment.

In this embodiment, an MLC program method is used unlike in the method of FIG. 4. In the MLC program method, 2-bit or more data is stored in one cell. Accordingly, threshold voltages have three or more distribution states. For example, in the case where a 2-bit MLC program operation is performed, a total of four distribution states, including an erase state, exist. In the case of an erase state, an additional reference voltage is not required in a verification operation. Accordingly, the verification operation is performed based on a total of three reference voltages PV1, PV2, and PV3. Here, it is assumed that cells to be programmed to have more than the third reference voltage PV3 are third cells to be programmed, cells to be programmed to have the third reference voltage PV3 or less, but more than the second reference voltage PV2 are second cells to be programmed, and cells to be programmed to have the second reference voltage PV2 or less, but more than the first reference voltage PV1 are first cells to be programmed.

First, as shown in FIG. 4, a program operation and a first verification operation based on the first reference voltage PV1 are performed. That is, after the program operation is performed on all of the cells to be programmed, the first verification operation is performed on the basis of the first reference voltage.

If, as a result of the first verification operation, a cell programmed to have the first reference voltage or more occurs, for example, 2 or 3 verification operations are performed on the first cells to be programmed on the basis of a reference voltage obtained by raising the first reference voltage.

Next, after a verification operation is performed, a first verification operation based on the first reference voltage is performed. A second verification operation based on a second reference voltage and a third verification operation based on a third reference voltage are then sequentially performed.

As described above, in one or more embodiments, a verification operation is performed based on a raised reference voltage from a point of time at which a cell programmed to have the first reference voltage or more occurs. Accordingly, the occurrence of under-programmed cells resulting from a source line bouncing phenomenon can be prevented.

What is claimed is:

1. A method of operating a nonvolatile memory device, the method comprising:

performing a first program operation and a first verification operation on memory cells until a memory cell having a threshold voltage higher than a first reference voltage first occurs among the memory cells; and when the memory cell having the threshold voltage higher than the first reference voltage first occurs among the memory cells, performing a second program operation and a second verification operation without further performing the first program operation and the first verification operation on others of the memory cells that do not have a threshold voltage higher than the first reference voltage, wherein the second verification operation uses for a threshold voltage detection a second reference voltage higher than the first reference voltage.

2. The method of claim 1, wherein the second program operation and the second verification operation are to be performed for a number of times less than or equal to a predetermined number.

3. The method of claim 2, further comprising, after the number of performance of the second program operation and the second verification operation reaches the predetermined number, performing a third program operation and the first verification operation.

4. The method of claim 1, wherein, when data to be stored in page buffers changes to program completion data, a memory cell having the threshold voltage higher than the first reference voltage is determined to have occurred.

5. The method of claim 1, wherein the second reference voltage is higher than the first reference voltage by about 50 mV.

6. The method of claim 1, wherein the second program operation and the second verification operation are performed up to two times or three times.

7. A method of operating a nonvolatile memory device, the method comprising:

performing a first program operation and a first verification operation on memory cells until a cell having a threshold voltage higher than a first reference voltage occurs;

when a cell having the threshold voltage higher than the first reference voltage occurs, performing a second program operation and performing a second verification operation using a second reference voltage higher than the first reference voltage; and after the second program operation and the second verification operation have been performed for a predetermined number of times, performing a third program operation and the first verification operation until threshold voltages of the memory cells are higher than the first reference voltage.

8. A method of operating a nonvolatile memory device, the method comprising:

performing a first program operation and a first verification operation on memory cells until a first memory cell having a threshold voltage higher than a first reference voltage first occurs among the memory cells; and when the first memory cell having the threshold voltage higher than the first reference voltage first occurs, performing a second program operation and a second verification operation for a number of times equal to or less than a predetermined number of times without further performing the first program operation and the first verification operation on others of the memory cells that do not have a threshold voltage higher than the first reference voltage, wherein the second verification operation is performed using a second reference voltage higher than the first reference voltage for a threshold voltage detection.

9. The method of claim 8, further comprising, if a further program operation and a further verification operation are to be performed after the second program operation and the second verification operation have been performed for the predetermined number of times, performing a third program operation and the first verification operation.

10. The method of claim 8, further comprising, if a further program operation and a further verification operation are to be performed after the second program operation and the second verification operation have been performed for the predetermined number of times, performing a third program operation, the first verification operation, and the second verification operation.

11. The method of claim 8, further comprising, if a further program operation and a further verification operation are to be performed after the second program operation and the second verification operation have been performed for the predetermined number of times, performing a third program operation, the first verification operation, and a third verification operation, wherein the third verification operation is performed using a third reference voltage higher than the second reference voltage for a threshold voltage detection.

12. The method of claim 8, wherein, in the performance of the first program operation and the first verification operation, when data to be stored in page buffers changes to program completion data, the first memory cell having the threshold voltage higher than the first reference voltage is determined to have occurred.

13. The method of claim 8, wherein the second reference voltage is higher than the first reference voltage by about 50 mV.

14. The method of claim 8, wherein the second program operation and the second verification operation are performed up to two times or three times.

* * * * *